(12) United States Patent
Ting et al.

(10) Patent No.: US 12,322,673 B2
(45) Date of Patent: Jun. 3, 2025

(54) 3DIC WITH HEAT DISSIPATION STRUCTURE AND WARPAGE CONTROL

(71) Applicant: Taiwan Semiconductor Manufacturing Co., Ltd., Hsinchu (TW)

(72) Inventors: Kuo-Chiang Ting, Hsinchu (TW); Sung-Feng Yeh, Taipei (TW); Ta Hao Sung, Hsinchu (TW); Jian-Wei Hong, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/543,819

(22) Filed: Dec. 18, 2023

(65) Prior Publication Data

US 2025/0069985 A1 Feb. 27, 2025

Related U.S. Application Data

(60) Provisional application No. 63/607,804, filed on Dec. 8, 2023, provisional application No. 63/520,710, filed on Aug. 21, 2023.

(51) Int. Cl.
| | |
|---|---|
| *H01L 23/373* | (2006.01) |
| *H01L 23/00* | (2006.01) |
| *H01L 23/498* | (2006.01) |
| *H01L 25/065* | (2023.01) |

(52) U.S. Cl.
CPC .... *H01L 23/3735* (2013.01); *H01L 23/49816* (2013.01); *H01L 23/49838* (2013.01); *H01L 24/05* (2013.01); *H01L 24/29* (2013.01); *H01L 25/0652* (2013.01); *H01L 2224/05006* (2013.01); *H01L 2224/05022* (2013.01); *H01L 2224/29005* (2013.01); *H01L 2224/29021* (2013.01); *H01L 2924/01029* (2013.01); *H01L 2924/15311* (2013.01); *H01L 2924/182* (2013.01); *H01L 2924/3511* (2013.01)

(58) Field of Classification Search
CPC . H01L 23/06; H01L 23/29–298; H01L 23/34; H01L 23/373–3738; H01L 23/562; H01L 25/0657; H01L 25/074
See application file for complete search history.

(56) References Cited

U.S. PATENT DOCUMENTS

2024/0128146 A1* 4/2024 Tong .................. H01L 23/3677

OTHER PUBLICATIONS

Tawain Semiconductor Manufacturing Co., Ltd., Info (Integrated Fan-Out) Wafer Level Packaging, https://3dfabric.tsmc.com/chinese/dedicatedFoundry/technology/InFO.htm, Dec. 18, 2023, 5 pages.

* cited by examiner

*Primary Examiner* — Evan G Clinton
(74) *Attorney, Agent, or Firm* — Slater Matsil, LLP

(57) ABSTRACT

A method includes bonding a bottom die to a carrier, and bonding a top die to the bottom die. The top die includes a semiconductor substrate, and the semiconductor substrate has a first thermal conductivity. The method further includes encapsulating the top die in a gap-fill region, bonding a supporting substrate to the top die and the gap-fill region to form a reconstructed wafer, wherein the supporting substrate has a second thermal conductivity higher than the first thermal conductivity, de-bonding the reconstructed wafer from the carrier, and forming electrical connectors on the bottom die.

20 Claims, 16 Drawing Sheets

3DIC WITH HEAT DISSIPATION STRUCTURE AND WARPAGE CONTROL

PRIORITY CLAIM AND CROSS-REFERENCE

This application claims the benefit of U.S. Provisional Application No. 63/607,804, filed on Dec. 8, 2023, and entitled "3DIC with heat dissipation structure and warpage control," and U.S. Provisional Application No. 63/520,710, filed on Aug. 21, 2023, and entitled "SCHEME AND MATERIAL FOR THERMAL DISSIPATION IMPROVEMENT AND WARPAGE CONTROL FOR SoIC," which applications are hereby incorporated herein by reference.

BACKGROUND

Integrated circuit packages may have a plurality of package components such as device dies and package substrates bonded together to increase the functionality and integration level. Due to the differences between different materials of the plurality of package components, warpage may occur. The warpage may cause non-bond issues, and some conductive features that are intended to be bonded to each other are not bonded, resulting in circuit failure. In addition, heat dissipation also becomes a more severe problem. These issues need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
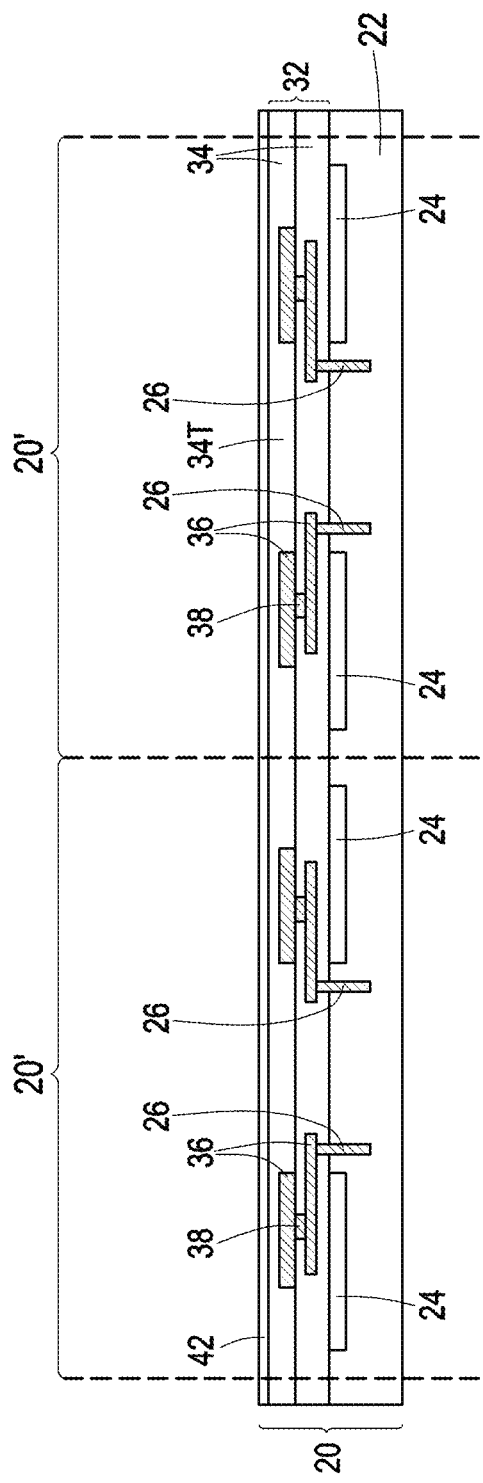
FIGS. 1-12 illustrate views of a process for forming a package with a supporting substrate having improved heat dissipation ability in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming a package with a supporting substrate having improved heat dissipation ability and the resulting structures are provided. In accordance with some embodiments, the supporting substrate is bonded over a device die, and is used for providing mechanical support in the formation of the package. The heat generated by the device die may efficiently dissipate through the supporting substrate. The stress and the warpage in the resulting package may also be reduced due to the properties of dummy dies and the supporting substrate. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 12 illustrate the cross-sectional views of intermediate stages in the formation of a package in accordance with some embodiments of the present disclosure. The corresponding processes are also reflected schematically in the process flow shown in FIG. 18.

Figure 18:
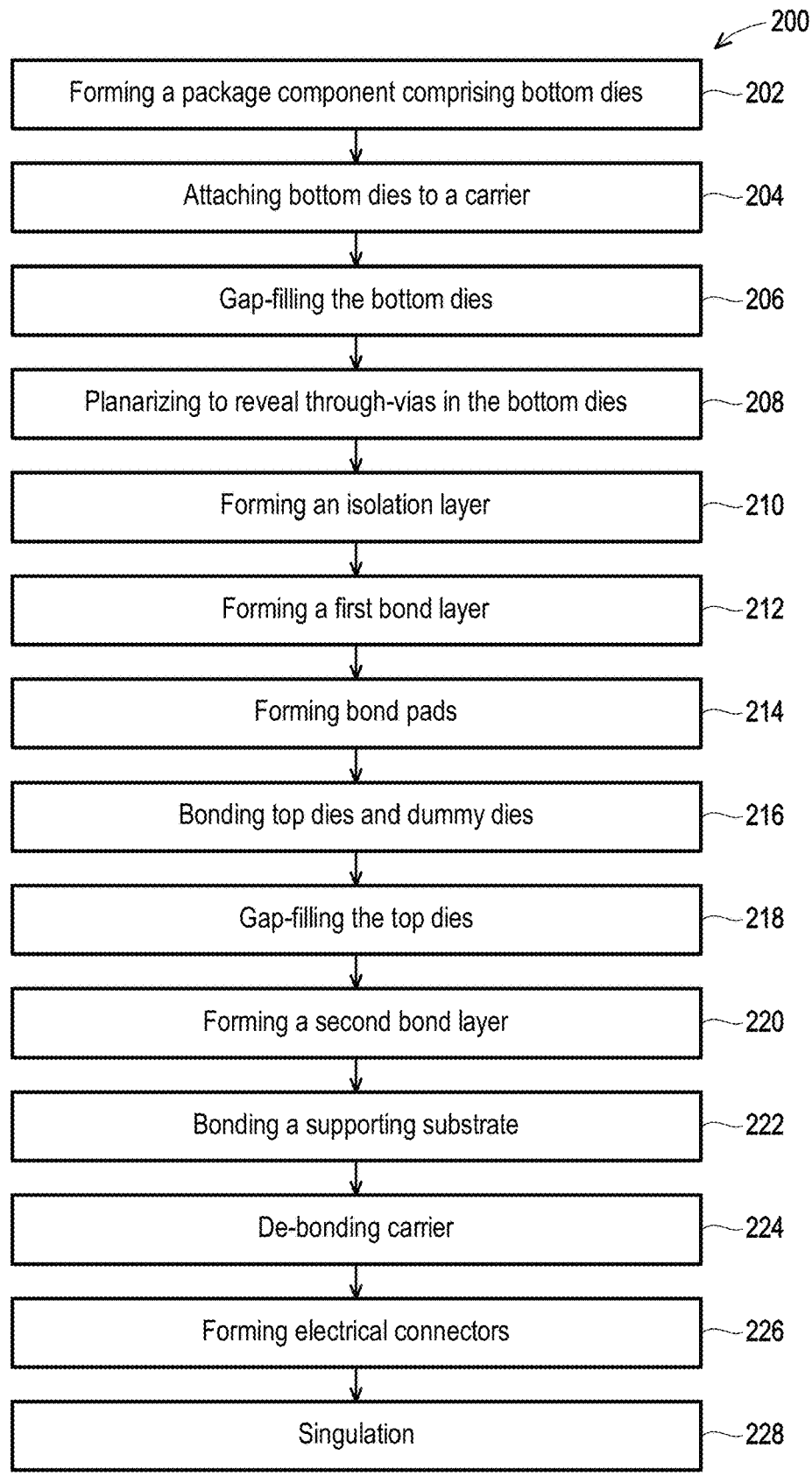
FIG. 18 illustrates a process flow for forming a package in accordance with some embodiments.

FIG. 1 illustrates a cross-sectional view in the formation of package component 20. The respective process is illustrated as process 202 in the process flow 200 as shown in FIG. 18. In accordance with some embodiments, package component 20 is a device wafer, which includes device dies 20' therein. Device dies 20' may include active devices and possibly passive devices, which are represented as integrated circuit devices 24. In accordance with alternative embodiments, package component 20 is an interposer die, which is free from active devices, and may or may not include passive devices. In accordance with yet alternative embodiments, package component 20 is or comprises a package such as an Integrated Fan-Out (InFO) Package, a redistribution structure including redistribution lines therein, or the like.

In accordance with some embodiments, package component 20 includes semiconductor substrate 22 and the features formed at a top surface of semiconductor substrate 22. Semiconductor substrate 22 may be formed of or comprise crystalline silicon, crystalline germanium, crystalline silicon germanium, carbon-doped silicon, a III-V compound semiconductor, or the like. Semiconductor substrate 22 may also be a bulk semiconductor substrate or a Semiconductor-On-Insulator (SOI) substrate.

In accordance with some embodiments, package component 20 includes integrated circuit devices, which are formed at the top surface of semiconductor substrate. Integrated circuit devices may include Complementary Metal-Oxide Semiconductor (CMOS) transistors, resistors, capacitors, diodes, and/or the like in accordance with some embodiments. The details of integrated circuit devices are not illustrated herein.

In accordance with some embodiments, package component 20 includes through-vias (also referred to as through-silicon vias (TSVs)) 26. TSVs 26 may be electrically connected to the integrated circuit devices 24. In accordance with some embodiments, TSVs 26 extend from the top surface of semiconductor substrate 22 (or a level higher than the top surface of semiconductor substrate 22) to an intermediate level of semiconductor substrate 22. The intermediate level of semiconductor substrate 22 is between the top surface and the bottom surface of semiconductor substrate 22. Each of the TSVs 26 is encircled by a dielectric isolation layer (not shown), which is used for electrically insulate the corresponding TSV 26 from semiconductor substrate 22.

Interconnect structure 32 is formed over semiconductor substrate 22 and integrated circuit devices 24. Interconnect structure 32 may include an Inter-Layer Dielectric (ILD, not marked separately) filling the spaces between the gate stacks of transistors (not shown) in integrated circuit devices 24. In accordance with some embodiments, the ILD is formed of silicon oxide, Phospho Silicate Glass (PSG), Boro Silicate Glass (BSG), Boron-doped Phospho Silicate Glass (BPSG), Fluorine-doped Silicate Glass (FSG), or the like. the ILD may be formed using spin-on coating, Flowable Chemical Vapor Deposition (FCVD), or the like. In accordance with some embodiments of the present disclosure, the ILD may also be formed using a deposition method such as Plasma Enhanced Chemical Vapor Deposition (PECVD), Low Pressure Chemical Vapor Deposition (LPCVD), or the like.

Contact plugs (not shown) are formed in the ILD, and are used to electrically connect integrated circuit devices 24 to overlying metal lines and vias. In accordance with some embodiments of the present disclosure, the contact plugs are formed of or comprise a conductive material selected from tungsten, aluminum, copper, titanium, tantalum, titanium nitride, tantalum nitride, alloys therefore, and/or multi-layers thereof. The formation of the contact plugs may include forming contact openings in the ILD, filling a conductive material(s) into the contact openings, and performing a planarization process (such as a Chemical Mechanical Polish (CMP) process or a mechanical grinding process) to level the top surfaces of the contact plugs with the top surface of the ILD.

In accordance with some embodiments, interconnect structure 32 further includes a plurality of dielectric layers 34, and a plurality of conductive features such as metal lines/pads 36 and vias 38 in the dielectric layers 34. Dielectric layers 34 may include low-k dielectric layers (also referred to as Inter-metal Dielectrics (IMDs)) in accordance with some embodiments. The dielectric constants (k values) of the low-k dielectric layers may be lower than about 3.5 or 3.0, for example. The low-k dielectric layers may comprise a carbon-containing low-k dielectric material, Hydrogen SilsesQuioxane (HSQ), MethylSilsesQuioxane (MSQ), or the like.

The formation of metal lines 36 and vias 38 in dielectric layers 34 may include single damascene processes and/or dual damascene processes. In a single damascene process for forming a metal line or a via, a trench or a via opening is first formed in one of dielectric layers 34, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 36 include top conductive (metal) features such as metal lines, metal pads, or vias in a top dielectric layer (denoted as dielectric layer 34T), which is the top layer of dielectric layers 34. In accordance with some embodiments, the top dielectric layer 34T is formed of a low-k dielectric material similar to the material of lower ones of dielectric layers 34. In accordance with some embodiments, the top dielectric layer 34T is formed of a non-low-k dielectric material such as silicon oxide, silicon nitride, undoped silicate glass, or the like. The top metal features in the top dielectric layer may also be formed of copper or a copper alloy, and may have a dual damascene structure or a single damascene structure.

Interconnect structure 32 may also include a passivation layer (not shown), which is over, and may be in contact with, an underlying dielectric layer 34 (such as top dielectric layer 34T). The passivation layer may be formed of a non-low-k dielectric material, which may comprise silicon and another element(s) including oxygen, nitrogen, carbon, and/or the like. For example, the passivation layer may be formed of or comprises SiON, SiN, SiOCN, SiCN, SiOC, SiC, or the like.

Bond layer 42 is formed over redistribution structure 32. Bond layer 42 may be formed of a silicon-containing dielectric material, which silicon-containing dielectric material may be selected from SiO, SiC, SiN, SiON, SiOC, SiCN, SiOCN, or the like, or combinations thereof. The bond layer 42 is planarized using a Chemical Mechanical Polish (CMP) process or a mechanical grinding process so that its top surfaces is coplanar.

A probe process may be performed, with the defect dies being found. The probe process may be performed on the top conductive features 36. A singulation process is then performed to saw package component 20 into a plurality of device dies 20'. Known-good-dies of device dies 20' are used in subsequent processes.

In accordance with alternative embodiments, instead of sawing package component 20 into device dies 20', and packaging the discrete device dies 20' at die level, the subsequent packaging process may be performed with package component 20 being packaged at wafer level, and wafer-on-wafer bonding is performed to bond device dies 20' to the wafer-level package component 20.

Figure 2:
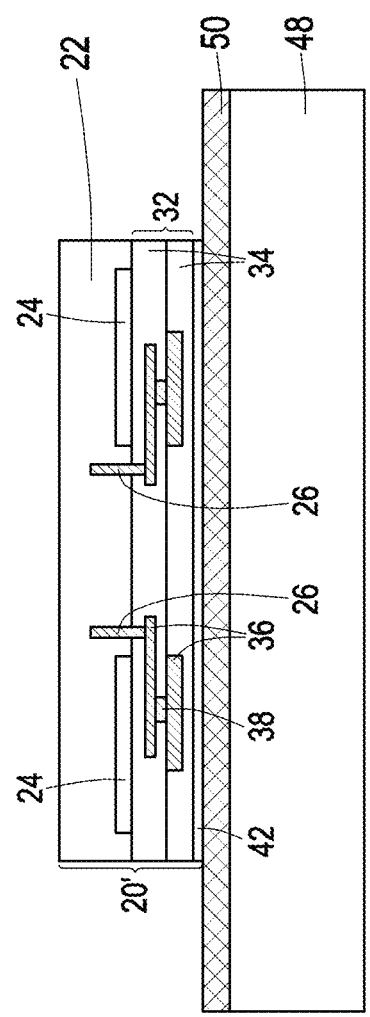

Referring to FIG. 2, the front side of device dies 20' (also referred to as bottom dies hereinafter) are attached to carrier 48. The respective process is illustrated as process 204 in the process flow 200 as shown in FIG. 18. It is appreciated that although one device die 20' is illustrated, there are a plurality of device dies 20' attached, and the plurality of device dies 20' may be arranged as an array. In accordance with some embodiments, carrier 48 is a semiconductor carrier such as a silicon carrier, and layer 50 is a bond layer. Layer 50 may also be formed of a silicon-containing dielectric material selected from SiO, SiC, SiN, SiON, SiOC, SiCN, SiOCN, or the like, or combinations thereof. Device dies 20' are attached to carrier 48, with bond layer 42 being bonded to layer 50 through fusion bonding in accordance with some embodiments.

In accordance with alternative embodiments, carrier 48 includes a transparent substrate such as a glass substrate, and layer 50 may be formed of an adhesive such as a light-to-heat-Conversion (LTHC) material, which is configured to be decomposed under the heat of light (such as a laser beam).

Figure 3:
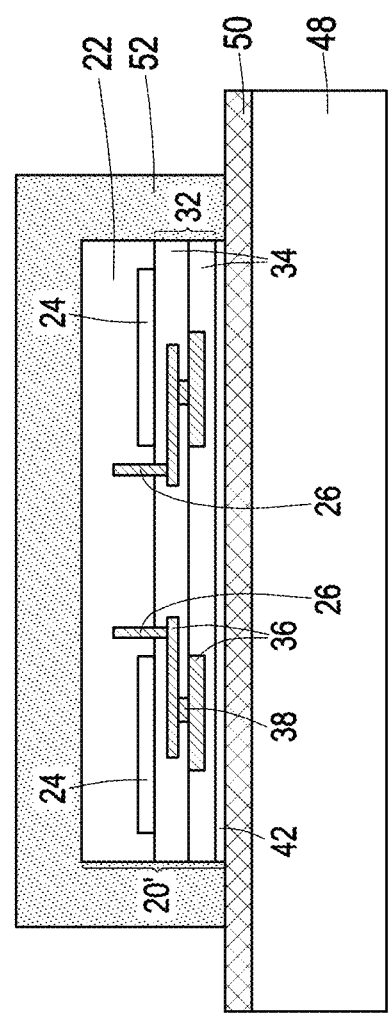

Next, as shown in FIG. 3, a gap-filling process is performed to fill the gaps between neighboring device dies 20', and to encapsulate device dies 20' in a gap-fill layer 52 (also referred to as an encapsulant). The respective process is illustrated as process 206 in the process flow 200 as shown in FIG. 18. In accordance with some embodiments, gap-fill layer 52 comprises a dielectric liner, and a dielectric gap-fill layer over the dielectric liner. The dielectric liner and the dielectric gap-fill layer are not shown separately. The dielectric liner may be formed of a material that has good adhesion to device dies 20'. In accordance with some embodiments, the dielectric liner is formed of or comprises silicon nitride. The dielectric liner is formed in a conformal deposition process, and hence is a conformal layer. The dielectric gap-fill layer may be formed of an oxide-base dielectric material such as silicon oxide, silicon oxynitride, a silicate glass, or the like. The dielectric liner and the dielectric gap-fill layer may be formed through deposition processes.

In accordance with alternative embodiments, gap-fill layer 52 is formed of or comprises a molding compound, a molding underfill, or the like. The corresponding process may include dispensing a dielectric material in a flowable form, and curing the dielectric material.

Figure 4:
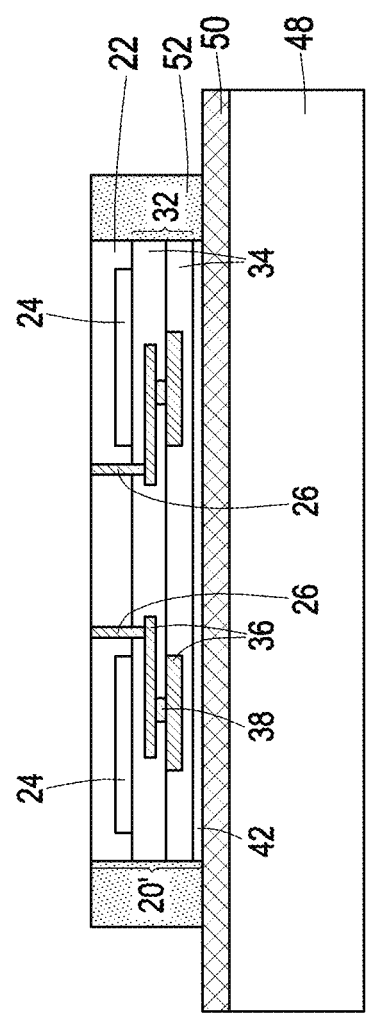

Referring to FIG. 4, after the gap-fill layer 52 is deposited, a planarization process is performed to level the top surfaces of device dies 20' with the top surface of the gap-fill layer 52. The respective process is illustrated as process 208 in the process flow 200 as shown in FIG. 18. The remaining portions of gap-fill layer 52 are referred to as gap-fill regions 52 hereinafter. In accordance with some embodiments, the planarization process is performed until TSVs 26 are revealed.

Figure 5:
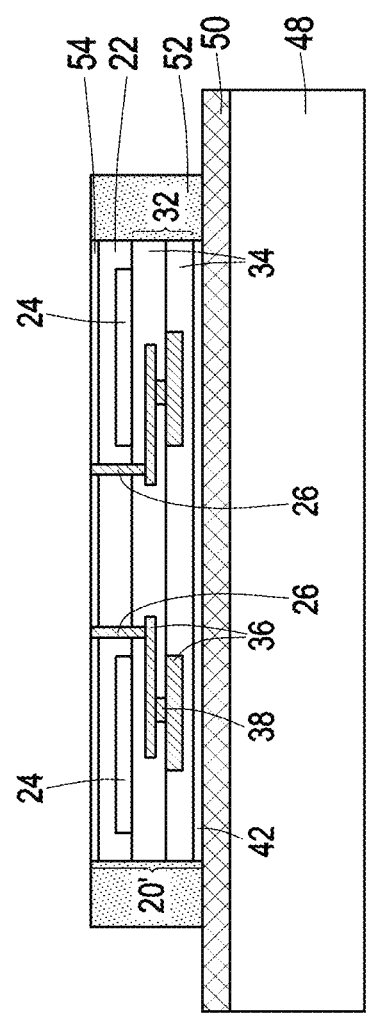

The semiconductor substrate 22 in device dies 20' may be recessed, so that the top portions of TSVs 26 protrude over semiconductor substrate 22. In the meantime, gap-fill regions 52 may be or may not be recessed. Dielectric isolation layer 54 may then be filled into the recesses, as shown in FIG. 5. The formation of isolation layer 54 may include performing a deposition process to deposit a dielectric layer into the recess, so that the protruding portions of TSVs 26 are in the dielectric layer, followed by a planarization process. The respective process is illustrated as process 210 in the process flow 200 as shown in FIG. 18. The portions of the dielectric layer over TSVs 26 are removed, and the remaining portions of the dielectric layer form the dielectric isolation layer 54, which becomes parts of device dies 20'.

Figure 6:
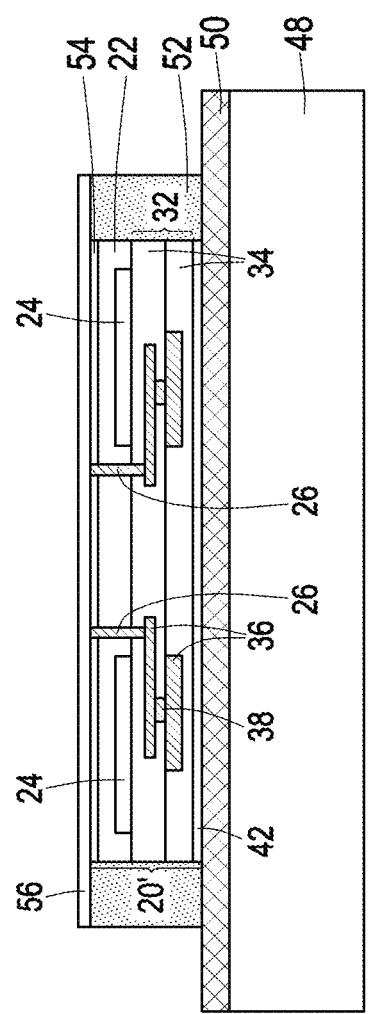

Referring to FIG. 6, bond layer 56 is deposited over device die 20' and gap-fill regions 52. The respective process is illustrated as process 212 in the process flow 200 as shown in FIG. 18. Bond layer 56 may be formed of a silicon-containing dielectric material, which silicon-containing dielectric material may be selected from SiO, SiC, SiN, SiON, SiOC, SiCN, SiOCN, or the like, or combinations thereof.

Figure 7:
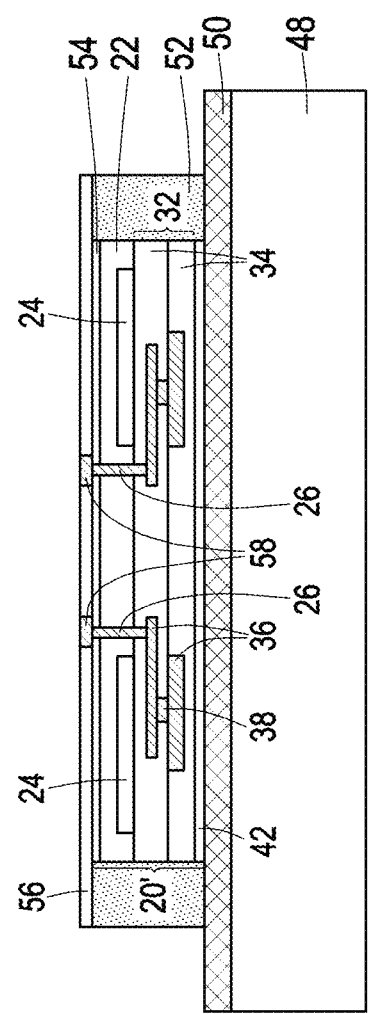

Referring to FIG. 7, bond pads 58 are formed in bond layer 56. The respective process is illustrated as process 214 in the process flow 200 as shown in FIG. 18. In accordance with some embodiments, bond pads 58 are formed by etching bond layer 56 to reveal through-vias 26, filling a conductive layer(s) into the resulting openings, and performing a planarization process such as a CMP process or a mechanical polish process. The top surfaces of bond pads 58 and bond layer 56 are thus coplanar with each other. Bond pads 58 may include a material selected from copper, titanium, titanium nitride, tantalum, tantalum nitride, or the like. For example, each bond pad 58 may include a titanium nitride barrier layer, and a copper region on the titanium nitride barrier layer.

Figure 8:
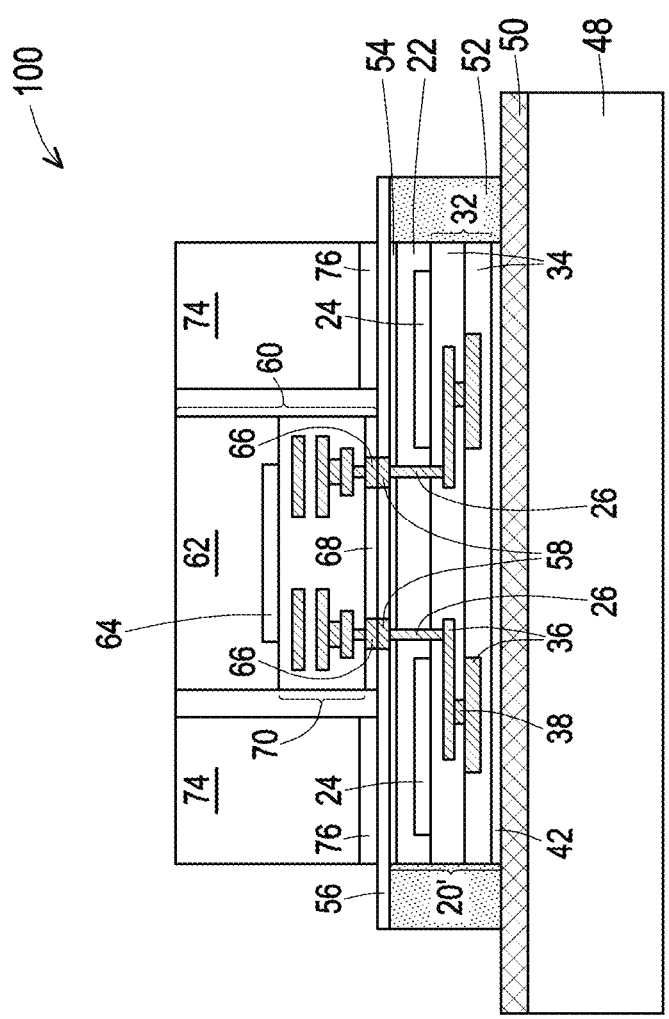

Referring to FIG. 8, device dies 60 (also referred to as top dies) are bonded to device dies 20'. The respective process is illustrated as process 216 in the process flow 200 as shown in FIG. 18. Although one device die 60 is illustrated, the illustrate device die 60 represent a plurality of device dies 60, each over and bonding to one of the underlying device dies 20'. The bonding may be performed through a face-to-back bonding process, with the front sides of device dies 60 being bonded to the backsides of device dies 20'. In accordance with some embodiments, each of device dies 60 may be a logic die, which may be a Central Processing Unit (CPU) die, a microcontroller (MCU) die, an input-output (IO) die, a BaseBand die, or the like. Device dies 60 may also include memory dies.

Device dies 60 may include semiconductor substrates 62, which may be silicon substrates. Device dies 60 include interconnect structures 70 for connecting to the active devices and passive devices in device dies 60. Interconnect structures 70 include metal lines and vias, as schematically illustrated.

Each of device dies 60 includes bond pads 66 and bond layer 68 (also referred to as a bond film) at the illustrated bottom surface of device die 60. The bottom surfaces of bond pads 66 may be coplanar with the bottom surface of bond layer 68. In accordance with some embodiments, bond layer 68 may be formed of a silicon-containing dielectric material, which may be selected from SiO, SiC, SiN, SiON, SiOC, SiCN, SiOCN, or the like, or combinations thereof. Bond pads 66 may comprise copper, and may be formed through a damascene process. The bond layer 68 and bond pads 66 are planarized so that their surfaces are coplanar, which may be resulted due to the CMP in the formation of bond pads 66.

The bonding may be achieved through hybrid bonding. For example, bond pads 66 are bonded to bond pads 58 through metal-to-metal direct bonding. In accordance with some embodiments, the metal-to-metal direct bonding is copper-to-copper direct bonding. Furthermore, the bond layers 68 of device dies 60 are bonded to bond layers 56 of the underlying device dies 20' through fusion bonding, for example, with Si—O—Si bonds being generated. The structure illustrated in FIG. 8 is referred to as reconstructed wafer 100 hereinafter, and more features will be formed to further expand the reconstructed wafer 100 in subsequent processes.

In accordance with some embodiments, as shown in FIG. 8, a plurality of dummy dies 74 are also attached to the underlying structure. In accordance with some embodiments, each of dummy dies 74 is attached through layer 76. Layer 76 may be a bond layer including a silicon-containing dielectric material, which may be selected from SiO, SiC, SiN, SiON, SiOC, SiCN, SiOCN, or the like, or combinations thereof. The attachment may be performed by bonding bond layer 76 to bond layer 56 through fusion bonding. In accordance with these embodiments, a same anneal process may be adopted to bond the dummy dies 74 and device dies 60 to the underlying structure.

In accordance with alternative embodiments, dummy die 74 is attached to the underlying bond layer 56 through an adhesive, which is also represented by layer 76. In accordance with these embodiments, dummy dies 74 may be attached to the underlying structure after the bonding of device dies 60.

In accordance with some embodiments, the entire dummy die 74 is formed of a homogeneous material, with no other materials and structures therein. The dummy dies 74 may have a thermal conductivity value that is higher than the thermal conductivity of silicon, and higher than the thermal conductivity of semiconductor substrate 62, which may also be formed of silicon. For example, the thermal conductivity of silicon may be about 150 watt/m-k, and hence the thermal conductivity of dummy dies 74 is higher than 150 watt/m-k, and may be in the range between about 160 watt/m-k and about 500 watt/m-k, or higher. Accordingly, the resulting package, with the dummy dies 74 having a thermal conductivity value higher than that of silicon, has a better heat dissipation ability than the structure adopting silicon as the dummy dies.

The dummy dies 74 may be formed of a dielectric material, a semiconductor material, a conductive material (such as a metal), or the like. For example, dummy die 74 may be formed of or comprise SiC (with thermal conductivity being about 160 watt/m-k), AlN (with thermal conductivity being about 180 watt/m-k), Ag (with thermal conductivity being about 429 watt/m-k), or the like, while other materials such as Al, BeO, Cu, Au, SiCN, or the like may also be used.

Since the main function of dummy dies 74 is for filling and reducing the volume of the gap-fill regions, the Young's modulus of dummy die 74 may be higher than, equal to, or lower than that of silicon, and higher than, equal to, or lower than that of semiconductor substrates 62. For example, the Young's modulus of silicon (and semiconductor substrates 62) may be in the range between about 130 GPa and about 190 GPa. Accordingly, the Young's modulus of dummy dies 74 may be smaller than about 150 GPa, or higher than about 150 GPa such as in the range between about 150 Gpa and about 500 GPa. For example, the Young's modulus of AlN, which may be used to form dummy dies 74, is about 300 GPa.

In accordance with some embodiments in which dummy dies 74 are capable of being bonded to bond layer 56 directly, dummy dies 74, which are homogeneous, are directly bonded to and in physical contact with bond layer 56. For example, when dummy dies 74 are formed of SiC, SiCN, or the like, dummy dies 74 may be in physical contact with bond layer 56 without layer 76 in between. Fusion bonds including Si—O—Si bonds may be generated to bond dummy dies 74 to bond layer 56.

Figure 9:
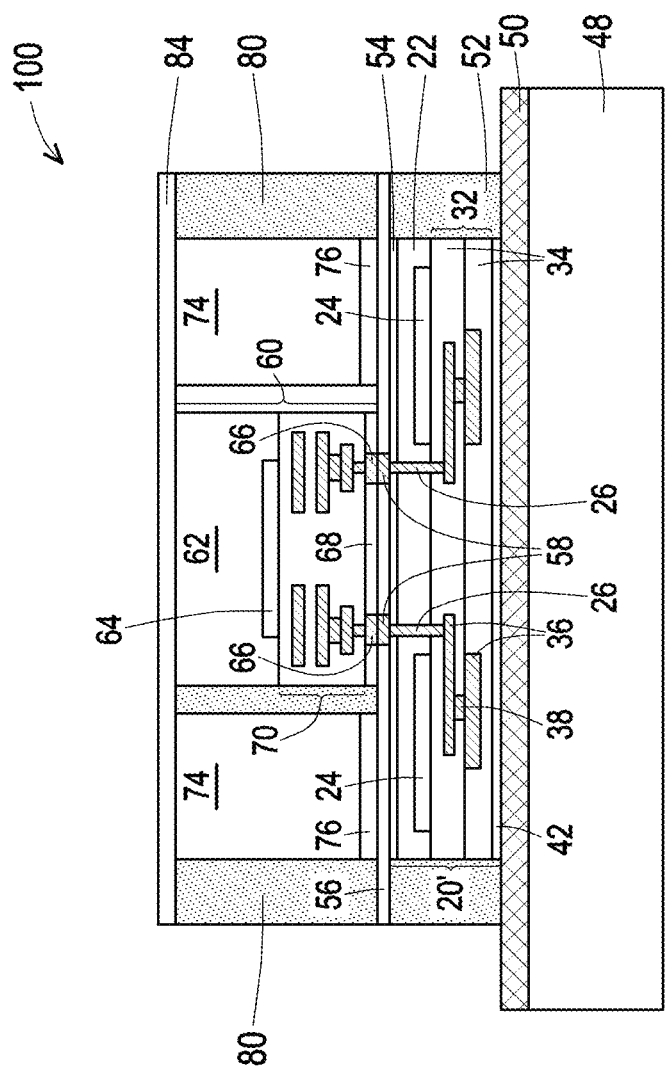

Referring to FIG. 9, gap-fill regions 80 (also referred to as an encapsulant) are formed. The respective process is illustrated as process 218 in the process flow 200 as shown in FIG. 18. The formation process, the structure, and the material of gap-fill regions 80 may be selected from the candidate formation processes, the candidate structures, and the candidate materials of gap-fill regions 52. For example, gap-fill regions 80 may include a dielectric liner, and a dielectric gap-fill layer over the dielectric liner. Alternatively, gap-fill regions 80 may comprise a molding compound, a molding underfill, or the like. A planarization process is performed to level the top surfaces of semiconductor substrates 62 of device dies 60, dummy dies 74, and gap-fill regions 80.

Further referring to FIG. 9, bond layer 84 is deposited on the semiconductor substrates 62 of device dies 60, dummy dies 74, and gap-fill regions 80. The respective process is illustrated as process 220 in the process flow 200 as shown in FIG. 18. Bond layer 84 may also be formed of or comprise a silicon-containing dielectric material, which may be selected from SiO, SiC, SiN, SiON, SiOC, SiCN, SiOCN, or the like, or combinations thereof. A planarization process may then be performed to level the top surface of bond layer 84.

Figure 10:
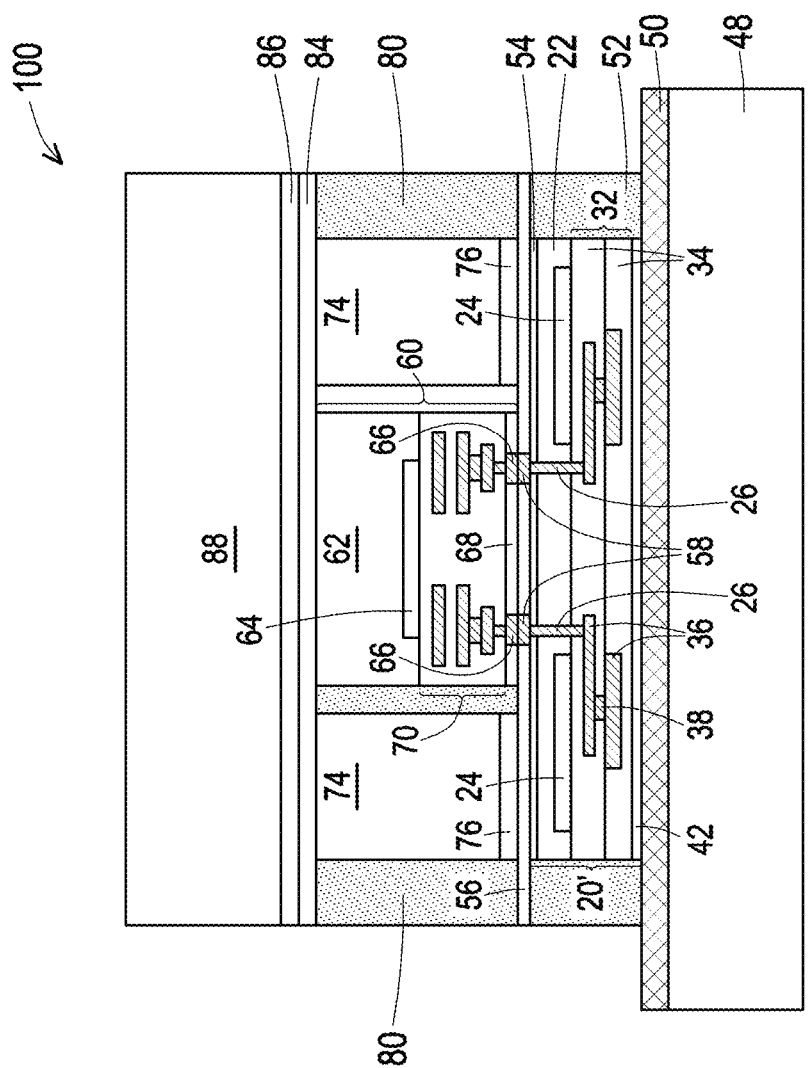

In a subsequent process, as shown in FIG. 10, supporting substrate 88 is bonded to reconstructed wafer 100. The respective process is illustrated as process 222 in the process flow 200 as shown in FIG. 18. A bond layer 86 may also be formed on supporting substrate 88, with the bond layer 86 being formed of a silicon-containing dielectric material selected from the same group of candidate materials of bond layer 84. The materials of bond layers 84 and 86 may be the same as each other or different from each other.

In accordance with some embodiments, the entire supporting substrate 88 is formed of a homogeneous material, with no other materials and structures therein. The material of supporting substrate 88 may have a thermal conductivity value that is higher than the thermal conductivity of silicon, and higher than the thermal conductivity of semiconductor substrates 62. For example, the thermal conductivity of supporting substrate 88 may be higher than 150 watt/m-k. Accordingly, the resulting package, with the supporting substrate 88 having a thermal conductivity higher than that of silicon, has a better heat dissipation ability than the structure adopting silicon as the supporting substrate. In accordance with some embodiments, the thermal conductivity of supporting substrate 88 may be higher than about 160 watt/m-k, and may be in the range between about 160 watt/m-k and about 500 watt/m-k, or higher.

The supporting substrate 88 may be formed of a dielectric material, a semiconductor material, a conductive material (such as a metal), or the like. For example, supporting substrate 88 may be formed of or comprise SiC, AlN, Al, BeO, Cu, Au, Ag, SiCN, or the like.

In accordance with some embodiments, for example, when dummy dies 74 are formed of a silicon-containing dielectric material such as SiC, SiCN, or the like, bond layer 84 may be skipped, and dummy dies 74 are directly bonded to, and in physical contact with, supporting substrate 88 or bond layer 86.

In accordance with some embodiments, for example, when supporting substrate 88 is formed of a silicon-containing dielectric material such as SiC, SiCN, or the like, bond layer 86 may be skipped, and supporting substrate 88 is directly bonded to, and in physical contact with, dummy dies 74 (and semiconductor substrate 62) or bond layer 84.

The bonding may be performed through fusion bonding, for example, with bond layer 86 being bonded to bond layer 84 through fusion bonding. Also, the fusion bonding may also occur when bond layer 84 and/or bond layer 86 are skipped. In accordance with some embodiments, supporting substrate 88 has a thickness great enough to support the subsequent processes such as the processes shown in FIGS. 11 and 12. The thickness of supporting substrate 88 may be greater than about 100 μm, and may be in the range between about 100 μm and about 1,000 μm.

Since supporting substrate 88 provides the mechanical support for supporting the reconstructed wafer 100 in subsequent processes, and may be used for reducing warpage, the Young's modulus of supporting substrate 88 is high so that it does not warp in the subsequent processes. The Young's modulus of supporting substrate 88 is higher than that of silicon and semiconductor substrates 62, so that it may provide more mechanical support than the otherwise silicon supporting substrate. For example, the Young's modulus of silicon may be in the range between about 130 GPa and about 190 GPa, and the Young's modulus of supporting substrate 88 may be higher than about 150 GPa or 200 GPa, in the range between about 150 GPa and about 500 GPa, or higher. For example, the Young's modulus of AlN is about 300 GPa.

While the material of supporting substrate 88 and dummy dies 74 may be selected from the same groups of candidate materials, as discussed, the material of supporting substrate 88 may be the same as, or different from, the material of dummy dies 74. Also, each of supporting substrate 88 and dummy dies 74 may be formed of a dielectric, a semiconductor, and a metal in any combination.

In accordance with some embodiments, the Young's modulus of supporting substrate 88 is higher than the Young's modulus of dummy dies 74. For example, the Young's modulus of dummy dies 74 may be lower than the Young's modulus of silicon substrates 62, so that dummy dies 74 may be used for absorbing stress, while the function of mechanically supporting the underlying structure is provided by supporting substrate 88, which has a higher Young's modulus, and may be able to prevent the warpage of reconstructed wafer 100. Accordingly, having dummy dies 74 with low Young's modulus and supporting substrate 88 with high Young's modulus in combination may provide good warpage-prevention ability and good thermal dissipation ability.

Figure 11:
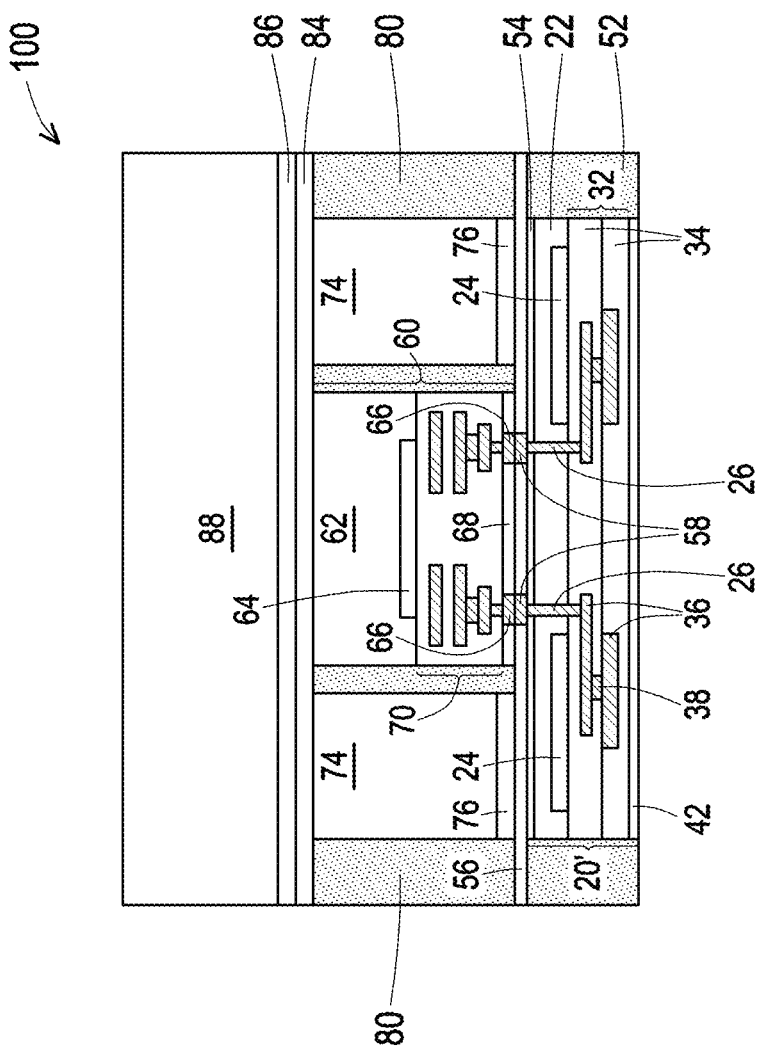

Carrier 48 is then de-bonded, and the resulting structure is illustrated in FIG. 11. The respective process is illustrated as process 224 in the process flow 200 as shown in FIG. 18. In accordance with some embodiments in which carrier 48 comprises a silicon wafer, carrier 48 may be removed through a smart cut process, which includes implanting carrier 48, for example, using hydrogen to generate a stress concentrated layer, and annealing the carrier 48, so that carrier 48 may be separated at the stress concentrated layer. The remaining portions of carrier 48 may be removed, for example, through etching, a CMP process, or a mechanical grinding process. Layer 50 (FIG. 10), which is a bond layer in accordance with these embodiments, may also be removed.

In accordance with alternative embodiments in which carrier 48 is a glass carrier, reconstructed wafer 100 may be de-bonded from carrier 48 by projecting a laser beam onto layer 50, which may be a LTHC coating material, so that the LTHC coating material is decomposed, releasing reconstructed wafer 100 from carrier 48.

Figure 12:
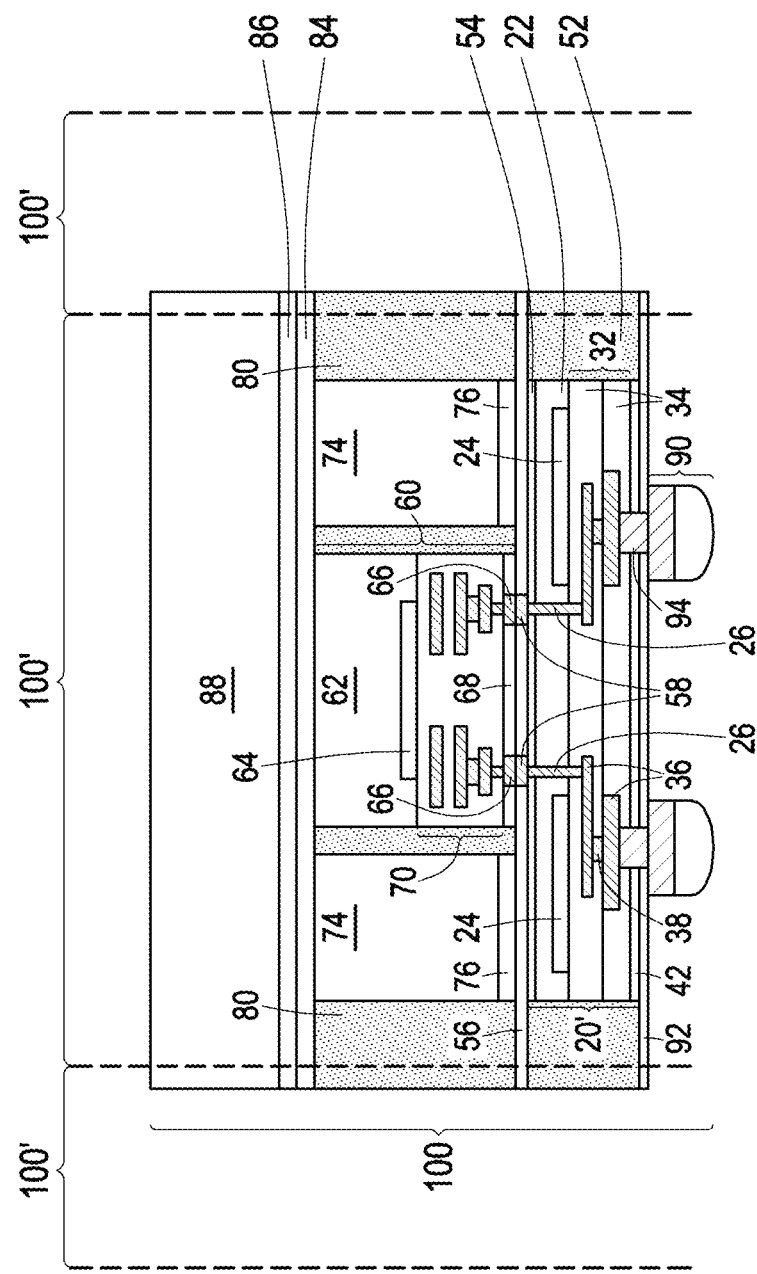

Next, as shown in FIG. 12, electrical connectors 90 are formed. The respective process is illustrated as process 226 in the process flow 200 as shown in FIG. 18. Dielectric layer 92 may or may not be formed. Dielectric layer 92, when formed, may be formed of or comprise silicon oxide, silicon nitride, silicon oxynitride, or the like. Vias 94 are formed to connect electrical connectors 90 to the redistribution structure 32. Electrical connectors 90 may comprise solder regions, metal pillars, and/or the like. Reconstructed wafer 100 is thus formed.

In subsequent processes, as also shown in FIG. 12, reconstructed wafer 100 is singulated in a sawing process, so that discrete packages 100' are formed. The respective process is illustrated as process 228 in the process flow 200 as shown in FIG. 18. The discrete packages 100' include device dies 20' and 60, and also include dummy dies 74 and supporting substrate 88', which are cut from supporting substrate 88.

Figure 13:
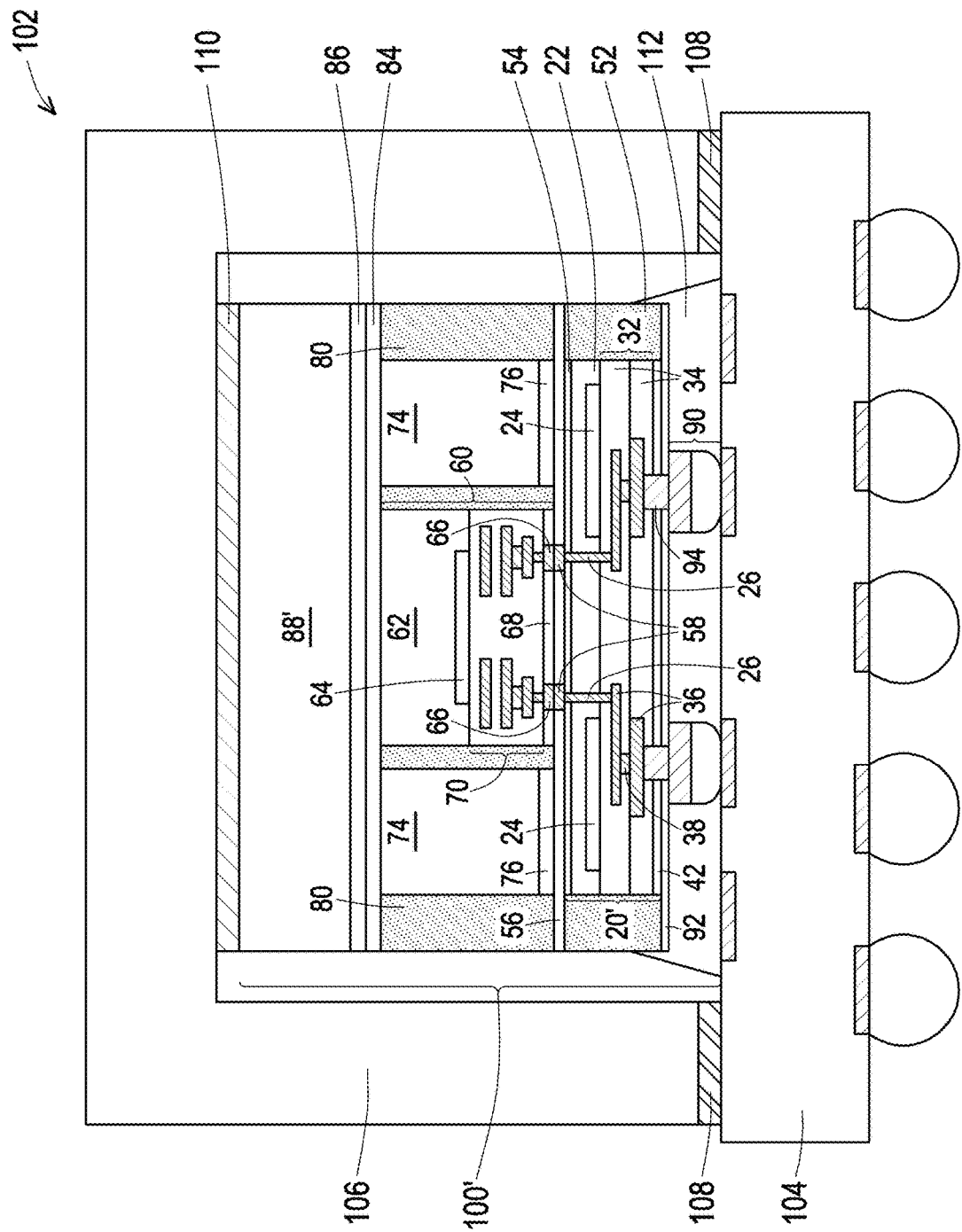
FIGS. 13-16 illustrate heat sinks attached to the packages with supporting substrates in accordance with some embodiments.

FIG. 13 illustrates package 102 incorporating the package 100'. In accordance with some embodiments, package 100' is bonded to package component 104, which may be or may include a package substrate, a silicon interposer, an organic interposer, another package, and/or the like. Heat sink 106, which is alternatively referred to as a heat spreader, is attached to package 100' through Thermal Interface Material (TIM) 110, which may include an adhesive and thermally conductive particles therein. Heat sink 106 may be formed of copper, aluminum, or other metals. Heat sink 106 is also attached to package component 104 through adhesive 108. Underfill 112 may be dispensed in the gap between package 100' and package component 104. Package 102 is thus formed.

In the structure shown in FIG. 13, the heat generated in device die 20' may be dissipated to heat sink 106 through several paths. The heat may dissipate from device die 20' to device die 60, through supporting substrate 88', and to heat sink 106. The heat generated in device dies 20' and 60 also dissipate through gap-fill regions 52 and 80, and dissipate to dummy dies 74. Since dummy dies 74 are formed of a material with high thermal conductivity, a low thermal resistance heat dissipation path is formed, which includes gap-fill regions 52, dummy dies 74, supporting substrate 88', and heat sink 106. In this structure, dummy dies 74 and supporting substrate 88', which have high thermal conductivity values, may improve the heat dissipation.

In accordance with alternative embodiments, a heat sink may be attached to the device die 20' as shown in FIG. 12. Accordingly, with dummy dies 74 having a higher thermal conductivity, the heat generated in device dies 60 may dissipate to dummy dies 74, and from dummy dies 74 into device die 20' and to the heat sink. Accordingly, in addition to the heat dissipation path from device dies 60 directly into device die 20' and to the heat sink, another heat dissipation path through dummy dies 74 also has reduced thermal resistance.

Figure 14:
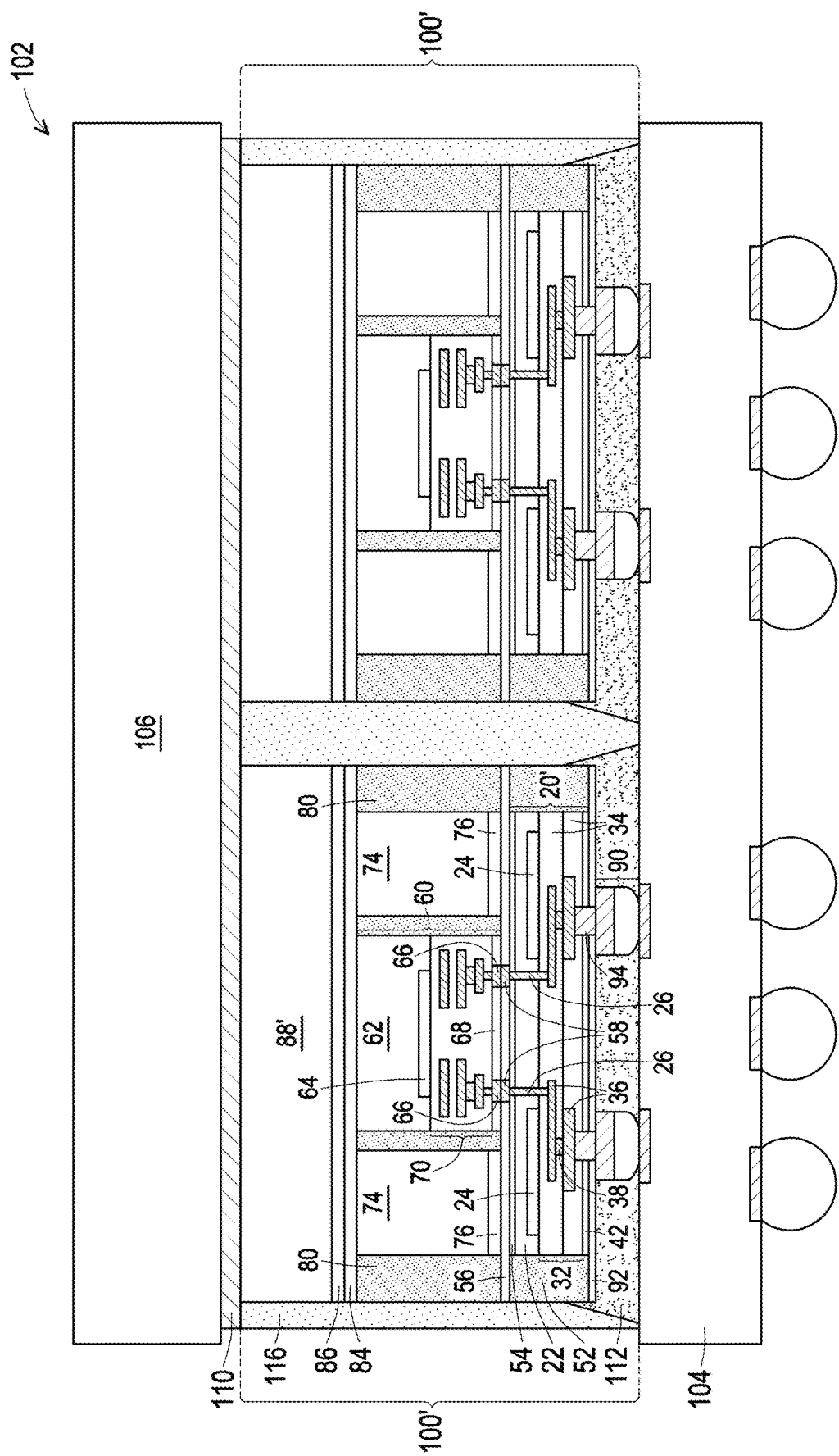

FIG. 14 illustrates a package 102 incorporating a plurality of packages 100' in accordance with alternative embodiments. In accordance with some embodiments, there are two or more packages 100' bonded to package component 104, which may be or may include a package substrate, a silicon interposer, an organic interposer, another package, and/or the like. The packages 100' may have the same structure or different structures. Underfill 112 may be dispensed in the gap between packages 100' and package component 104. Encapsulant 116, which may comprise a molding compound, a molding underfill, or the like, may encapsulate packages 100'.

Heat sink 106 is attached to packages 100' through TIM 110, which may include an adhesive and thermally conductive particles therein. Heat sink 106 may be formed of copper, aluminum, or other metals. Although FIG. 14 illustrates that heat sink 106 is not attached to package component 104, heat sink 106 may also be attached to package component 104, similar to the structure shown in FIG. 13.

Figure 15:
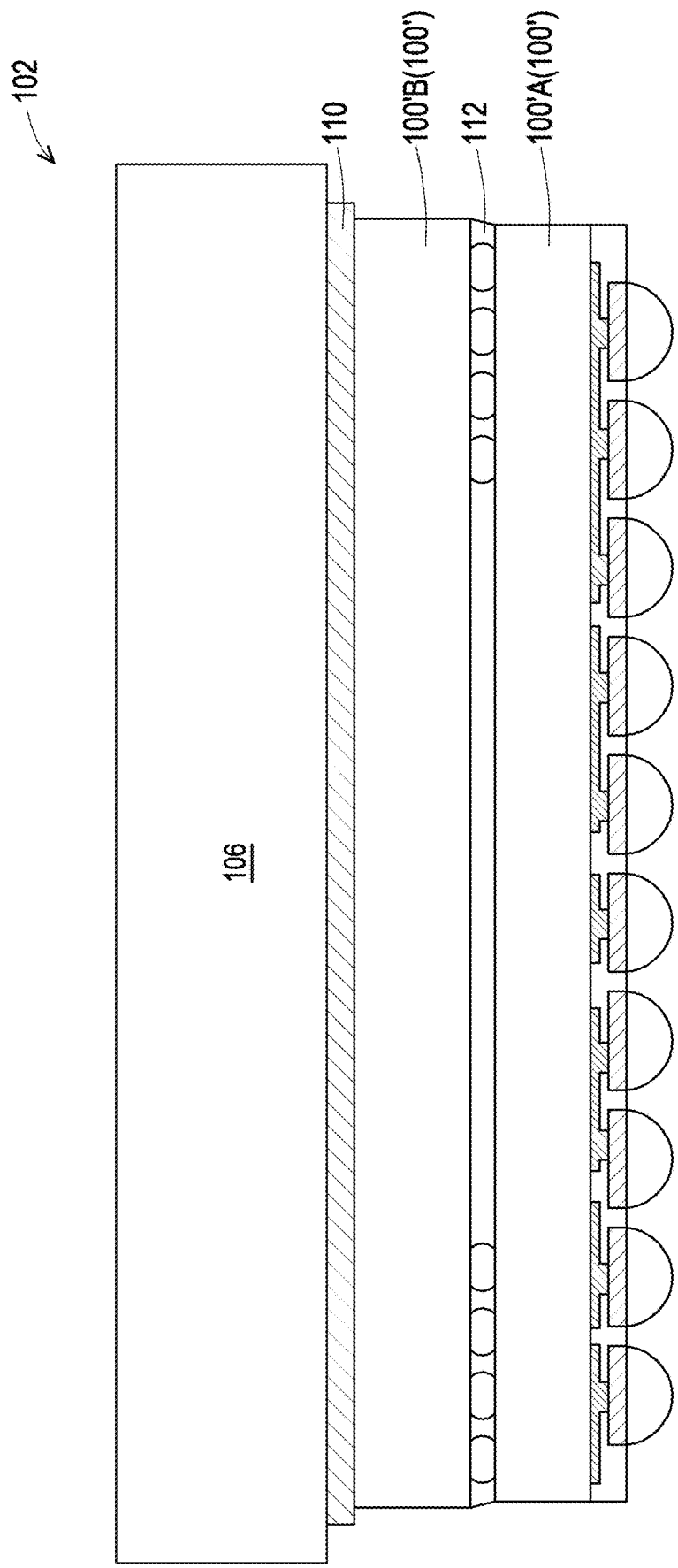

FIG. 15 illustrates a package 102 incorporating a plurality of stacked packages 100' (including packages 100'A and 100'B). Each of the packages 100'A and 100'B may have the same or similar structure as the packages 100' as in FIG. 12. In accordance with some embodiments, there are two or more packages 100' stacked, with the upper package 100'A overlapping and bonding to the lower package 100'B. The packages 100' may have the same structure or different structures. Underfill 112 may be dispensed in the gap between packages 100'A and 100'B.

Heat sink 106 may be attached to the top package 100'A through TIM 110, which may include an adhesive and thermally conductive particles therein. Heat sink 106 may be formed of copper, aluminum, or other metals. TIM 110 may be in physical contact with the supporting substrate 88' (FIG. 12) of the respective underlying package 100'A. Underfill 112 may be in physical contact with the supporting substrate 88' (FIG. 12) of the respective underlying package 100'B.

Figure 16:
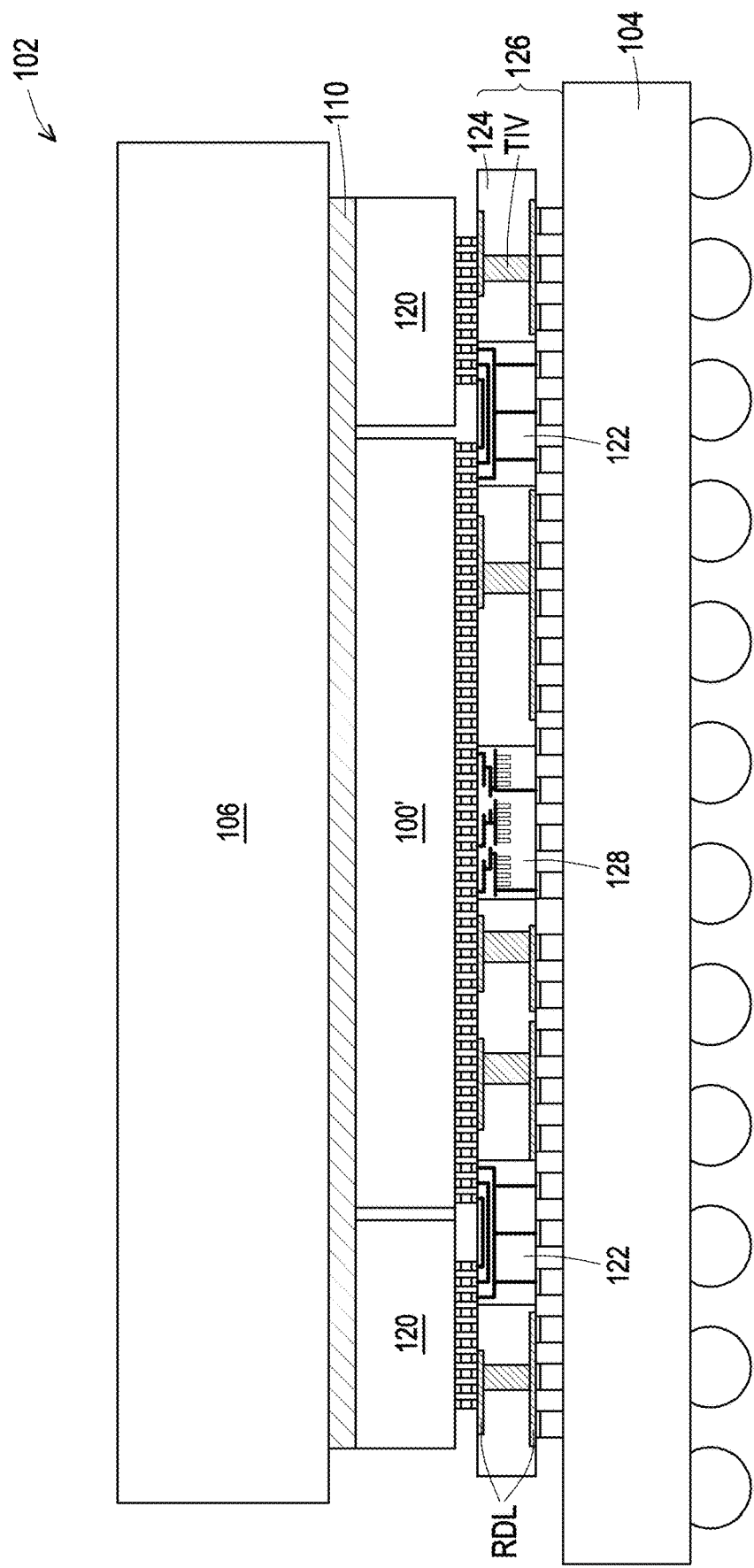

FIG. 16 illustrates a package 102 incorporating package 100' and a plurality of package components 120 interconnected through bridge dies 122 (also referred to as local interconnect dies). In accordance with some embodiments, bridge dies 122 are encapsulated in encapsulant 124, which may be a molding compound, to form interconnect structure 126. Neighboring ones of package 100' and package components 120 are bonded to, and are interconnected by, bridge dies 122. Independent Passive Devices (IPDs) 128 are also encapsulated in encapsulant 124. Interconnect structure 126 may be further bonded to package component 104.

Heat sink 106 may be attached to the package 100' and package components 120 through TIM 110, which may include an adhesive and thermally conductive particles therein. Heat sink 106 may be formed of copper, aluminum, or other metals. TIM 110 may be in physical contact with the supporting substrate 88' (FIG. 12) of the underlying package 100'.

Figure 17:
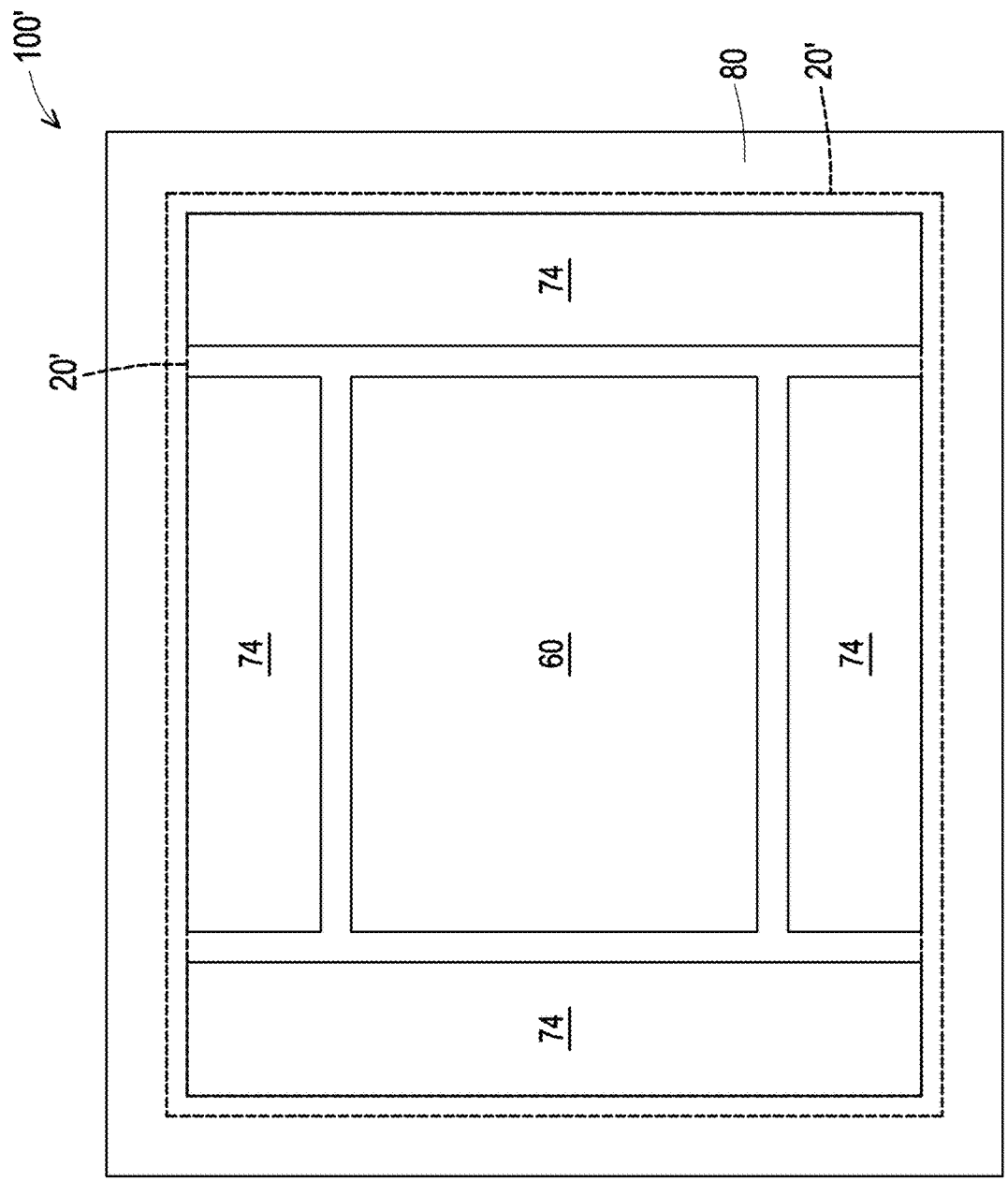
FIG. 17 illustrates a top view of a package in accordance with some embodiments.

FIG. 17 illustrates a top view of the package 100' as shown in FIG. 12 in accordance with some embodiments. Device die 20' may extend laterally beyond all sides of device die 60. Device die 60 may be surrounded by dummy dies 74 and gap-fill regions 80. FIG. 17 illustrates two possible positions of the edges of device die 20'. Some possible edges are vertically aligned to the respective outer edges of dummy dies 74, and some other possible edges may extend beyond the respective edges of dummy dies 74.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming a supporting substrate with increased thermal conductivity and increased Young's modulus, the supporting substrate can conduct heat efficiently, and may provide better mechanical support to the underlying structure. Dummy dies may also have increased thermal conductivity, and may also conduct heat efficiently.

In accordance with some embodiments of the present disclosure, a method comprises bonding a bottom die to a carrier; bonding a top die to the bottom die, wherein the top die comprises a semiconductor substrate, and the semiconductor substrate has a first thermal conductivity; encapsulating the top die in a first gap-fill region; bonding a supporting substrate to the top die and the first gap-fill region to form a reconstructed wafer, wherein the supporting substrate has a second thermal conductivity higher than the first thermal conductivity; de-bonding the reconstructed wafer from the carrier; and forming electrical connectors on the bottom die. In an embodiment, the supporting substrate comprises a metal substrate. In an embodiment, the supporting substrate comprises a dielectric substrate.

In an embodiment, the dielectric substrate of the supporting substrate is in physical contact with an additional semiconductor substrate of the top die. In an embodiment, the method further comprises sawing the reconstructed wafer into a plurality of packages, wherein each of the packages comprises a piece of the supporting substrate. In an embodiment, the method further comprises attaching a heat sink to one of the plurality of packages, with a thermal interface material (TIM) between, and contacting both of, the heat sink and the supporting substrate in the one of the plurality of packages.

In an embodiment, the method further comprises, before the top die is bonded to the bottom die, encapsulating the bottom die in a second gap-fill region. In an embodiment, the supporting substrate further has a Young's modulus higher than the Young's modulus of the semiconductor substrate of the top die. In an embodiment, the method further comprises bonding a dummy die to the bottom die, wherein the dummy die is encapsulated in the first gap-fill region, and wherein the dummy die has a third thermal conductivity higher than the first thermal conductivity.

In an embodiment, the dummy die has a Young's modulus lower than the Young's modulus of the semiconductor substrate of the top die. In an embodiment, a first bottom surface of the top die and a second bottom surface of the dummy die are bonded to, and are in physical contact with, a same bond layer of the bottom die, and wherein an entirety of the dummy die is formed of a homogeneous material.

In accordance with some embodiments of the present disclosure, a structure comprises a bottom die; a top die over and bonding to the bottom die, wherein the top die comprises a semiconductor substrate having a first thermal conductivity; a first gap-fill region encapsulating the top die; a supporting substrate bonding to the top die, wherein the supporting substrate has a second thermal conductivity higher than the first thermal conductivity; a bond film between the supporting substrate and the top die; and electrical connectors on a front side of the bottom die.

In an embodiment, the structure further comprises a thermal interface material over and contacting the supporting substrate; and a heat sink over and contacting the thermal interface material. In an embodiment, the structure further comprises an underfill over and contacting the supporting substrate. In an embodiment, the supporting substrate comprises a metal. In an embodiment, the supporting substrate comprises a dielectric material.

In accordance with some embodiments of the present disclosure, a structure comprises a top die comprising a semiconductor substrate, wherein the semiconductor substrate has a first Young's modulus; a gap-fill region encapsulating the top die therein; a supporting substrate over and bonding to the top die, wherein the supporting substrate has a second Young's modulus higher than the first Young's modulus; a thermal interface material over and contacting the supporting substrate; and a heat sink over and attached to the thermal interface material.

In an embodiment, the structure further comprises a dummy die in the gap-fill region, wherein the dummy die comprises a first material different from a second material of the semiconductor substrate. In an embodiment, the dummy die has a third Young's modulus different from the first Young's modulus. In an embodiment, the dummy die comprises a dielectric material or a metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a bottom die;
    a top die over and bonding to the bottom die, wherein the top die comprises a semiconductor substrate having a first thermal conductivity;
    a first gap-fill region encapsulating the top die, wherein the first gap-fill region comprises a first edge and a second edge opposing to the first edge;
    a supporting substrate bonding to the top die, wherein the supporting substrate has a second thermal conductivity higher than the first thermal conductivity, and wherein the supporting substrate comprises a third edge vertically aligned to the first edge, and a fourth edge vertically aligned to the second edge;
    a bond film between the supporting substrate and the top die; and
    electrical connectors on a front side of the bottom die.

2. The structure of claim 1 further comprising:
    a thermal interface material over and contacting the supporting substrate; and
    a heat sink over and contacting the thermal interface material.

3. The structure of claim 1 further comprising an underfill underlying and contacting the bottom die.

4. The structure of claim 1, wherein the supporting substrate comprises a metal.

5. The structure of claim 1, wherein the supporting substrate comprises a dielectric material.

6. The structure of claim 1 further comprising a molding compound contacting the first edge, the second edge, the third edge, and the fourth edge to form vertical interfaces.

7. A structure comprising:
    a top die comprising a semiconductor substrate, wherein the semiconductor substrate has a first Young's modulus;
    a gap-fill region encapsulating the top die therein;
    a supporting substrate over and bonding to the top die, wherein the supporting substrate has a second Young's modulus higher than the first Young's modulus;
    an encapsulant on opposing sides of, and contacting, the supporting substrate;
    a thermal interface material over and contacting the supporting substrate; and
    a heat sink over and attached to the thermal interface material.

8. The structure of claim 7 further comprising a dummy die in the gap-fill region, wherein the dummy die comprises a first material different from a second material of the semiconductor substrate.

9. The structure of claim 8, wherein the dummy die has a third Young's modulus different from the first Young's modulus.

10. The structure of claim 8, wherein the dummy die comprises a dielectric material or a metal.

11. The structure of claim 7, wherein the encapsulant further contacts opposite edges of the thermal interface material and the heat sink.

12. A structure comprising:
    a bottom die;
    a top die over and joined to the bottom die, wherein the top die comprises a semiconductor substrate, and the semiconductor substrate has a first thermal conductivity;
    a first gap-fill region encapsulating the top die therein;
    a dummy die encapsulated in the first gap-fill region, wherein the dummy die has a third thermal conductivity higher than the first thermal conductivity, and wherein the dummy die has a Young's modulus lower than the Young's modulus of the semiconductor substrate of the top die;
    a supporting substrate attached the top die and the first gap-fill region, wherein the supporting substrate has a second thermal conductivity higher than the first thermal conductivity; and
    electrical connectors on the bottom die.

13. The structure of claim 12, wherein the supporting substrate comprises a metal substrate.

14. The structure of claim 12, wherein the supporting substrate comprises a dielectric substrate.

15. The structure of claim 14, wherein the dielectric substrate of the supporting substrate is in physical contact with an additional semiconductor substrate of the top die.

16. The structure of claim 12, wherein the bottom die and the top die are comprised in a package that comprises first edges, and wherein the supporting substrate comprises second edges, and wherein the first edges comprise second edges.

17. The structure of claim 12 further comprising a heat sink and a thermal interface material (TIM) between, and contacting both of, the heat sink and the supporting substrate.

18. The structure of claim 12 further comprising, before the top die is bonded to the bottom die, encapsulating the bottom die in a second gap-fill region.

19. The structure of claim 12, wherein the supporting substrate further has a Young's modulus higher than the Young's modulus of the semiconductor substrate of the top die.

20. The structure of claim 12, wherein a first bottom surface of the top die and a second bottom surface of the dummy die are joined to, and are in physical contact with, a same bond layer of the bottom die, and wherein an entirety of the dummy die is formed of a homogeneous material.

* * * * *